(12) United States Patent
Gupta et al.

(10) Patent No.: US 6,388,479 B1
(45) Date of Patent: May 14, 2002

(54) OSCILLATOR BASED POWER-ON-RESET CIRCUIT

(75) Inventors: Rajat Gupta; Sunil Thamaran, both of Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/532,582

(22) Filed: Mar. 22, 2000

(51) Int. Cl.[7] .................................................. H03L 7/00
(52) U.S. Cl. ........................................ 327/143; 327/198
(58) Field of Search ................................. 327/143, 198

(56) References Cited

U.S. PATENT DOCUMENTS 5,212,412 A  *  5/1993  Atriss et al. ................. 327/143
5,347,173 A  *  9/1994  McAdams .................... 327/143
5,386,152 A  *  1/1995  Naraki ......................... 327/143

* cited by examiner

Primary Examiner—Kenneth B. Wells
(74) Attorney, Agent, or Firm—Christopher P. Maiorana, P.C.

(57) ABSTRACT

An apparatus comprising a first circuit and a second circuit. The first circuit may be configured to generate a first signal comprising a series of one or more pulses. The second circuit may be configured to generate a second signal in response to the first signal. The second signal may be configured to control the reset of an external device. In one example, the present invention may be implemented as a power on reset circuit.

22 Claims, 2 Drawing Sheets

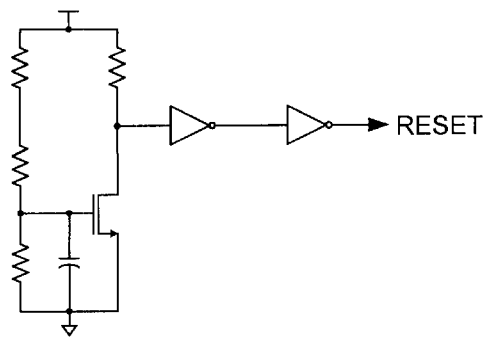
(CONVENTIONAL)
FIG. 1

US 6,388,479 B1

OSCILLATOR BASED POWER-ON-RESET CIRCUIT

FIELD OF THE INVENTION

The present invention relates to a method and architecture for power-on-reset generally and, more particularly, to a method and architecture for an oscillator based power-on-reset.

BACKGROUND OF THE INVENTION

Conventional power-on-reset circuits use large on-chip resistor dividers to establish trip points with respect to the transistor threshold. These resistors add complexity and require a large area on the chip. Due to the large charge/discharge time associated with the resistor dividers, the time it takes for the power on reset circuit to reset during a drop in voltage (brown-out performance) can be slower than required. FIG. 1 illustrates an example of such a conventional circuit.

SUMMARY OF THE INVENTION

The present invention concerns an apparatus comprising a first circuit and a second circuit. The first circuit may be configured to generate a first signal comprising a series of one or more pulses. The second circuit may be configured to generate a second signal in response to the first signal. The second signal may be configured to control the reset of an external device. In one example, the present invention may be implemented as a power on reset circuit.

The object features and advantages of the present invention include providing a method and/or architecture for a power on reset circuit that may (i) be implemented with any relaxation oscillator, (ii) reduce the overall circuit complexity, (iii) reduce the overall circuit size, (iv) provide guaranteed stability, (v) improve a brown out detection, (vi) be insensitive to power supply ramp, and/or (vii) be insensitive to process variation (C and R does not vary much).

BRIEF DESCRIPTION OF THE DRAWINGS

These and other objects, features and advantages of the present invention will be apparent from the following detailed description and the appended claims and drawings in which:

FIG. 1 is a schematic of a conventional power on reset circuit;

DETAILED DESCRIPTION OF THE PREFERRED EMBODIMENTS

The present invention concerns a method and/or architecture for implementing a power on reset that (i) may be implemented using a variety of relaxation oscillators and (ii) may reduce the response time of the reset to a brown out (brown out performance) while reducing a circuits complexity and size.

Figure 2:
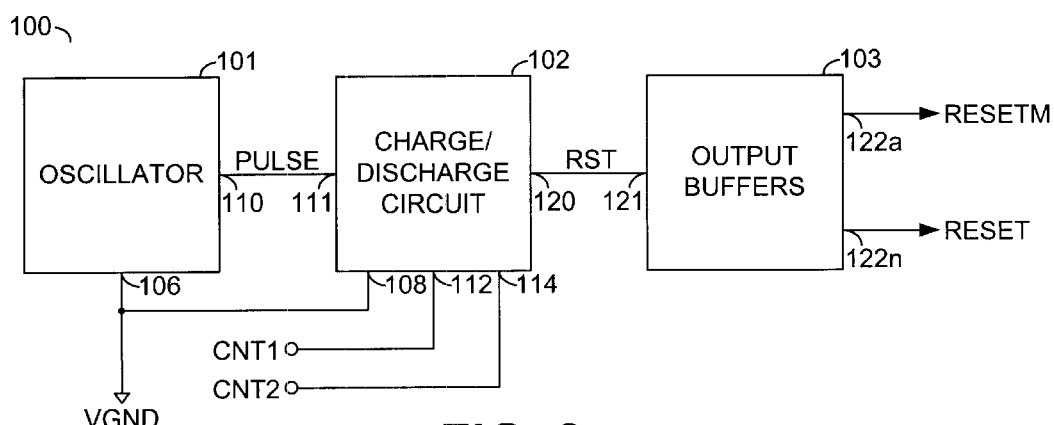
FIG. 2 is a block diagram of a preferred embodiment of the present invention.

Referring to FIG. 2, a block diagram of a circuit 100 is shown in accordance with a preferred embodiment of the present invention. The circuit 100 generally comprises an oscillator block (or circuit) 101, a charge/discharge block (or circuit) 102 and an output buffer block (or circuit) 103. The circuit 100 may be implemented, in one example, as a power on reset circuit.

The oscillator circuit 101 may have an input 106 that may receive a signal (e.g., VGND). Additionally, the signal VGND may be presented to an input 108 at the charge/discharge circuit 102. The signal VGND may be implemented as, in one example, ground. However, the signal VGND may be implemented at an appropriate level in order to meet the criteria of a particular implementation.

The oscillator circuit 101 may have an output 110 that may present a signal (e.g., PULSE) to an input 111 of the charge/discharge circuit 102. The signal PULSE may be implemented as the output of an oscillator circuit resulting in a train of pulses. The charge/discharge circuit 102 may additionally have an input 112 that may receive a signal (e.g., CNT1) and an input 114 that may receive a signal (e.g., CNT2). The signals CNT1 and CNT2 may be implemented as, in one example, control voltages. However, the signals CNT1 and CNT2 may be implemented as other appropriate type signals in order to meet the criteria of a particular implementation. The charge/discharge circuit 102 may have an output 120 that may present a signal (e.g., RST) to an input 121 of the output buffer circuit 103. The charge/discharge circuit 102 may determine a differential state in response to the signal PULSE. The charge/discharge circuit 102 may present the signal RST in response to the signal PULSE. The output buffer circuit 103 may have a number of outputs 122a–122n that may present one or more output signals (e.g., RESET and RESETM).

Figure 3:
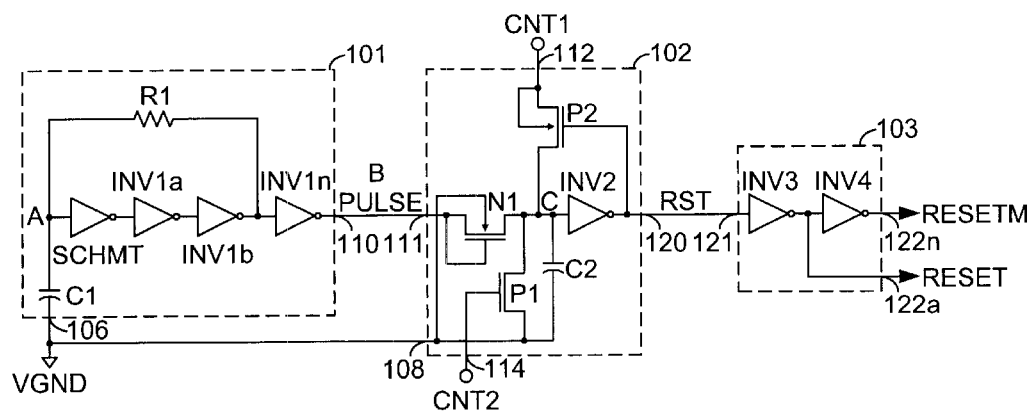
FIG. 3 is a detailed schematic of the circuit of FIG. 2.

Referring to FIG. 3, a more detailed diagram of the oscillator circuit 101 is shown. The oscillator circuit 101 may comprise a capacitor C1, a resistor R1, an inverter SCHMT and a number of inverters INV1a, INV1b and INV1n. The resistor R1, the capacitor C1 and the inverter SCHMT may form a relaxation oscillator. In one example, the relaxation oscillator may be a Schmitt based RC oscillator. In another example, the inverter INV1a and INV1b may be buffers to the oscillator circuit 101. The oscillator circuit 101 may have an output 110 that may present a signal (e.g., PULSE) to an input 111 of the charge/discharge circuit 102. The charge/discharge circuit 102 may comprise a transistor N1, P1 and P2, a capacitor C2 and an inverter INV2.

The charge/discharge circuit 102 may have an output 120 that may present the signal RST to an input 121 of the buffer circuit 103. The buffer circuit 103 may comprise an inverter INV3 and an inverter INV4. In one example the circuit 103 may form an output buffer. The output buffer circuit 103 may present the signals RESET and RESETM.

Figure 4:
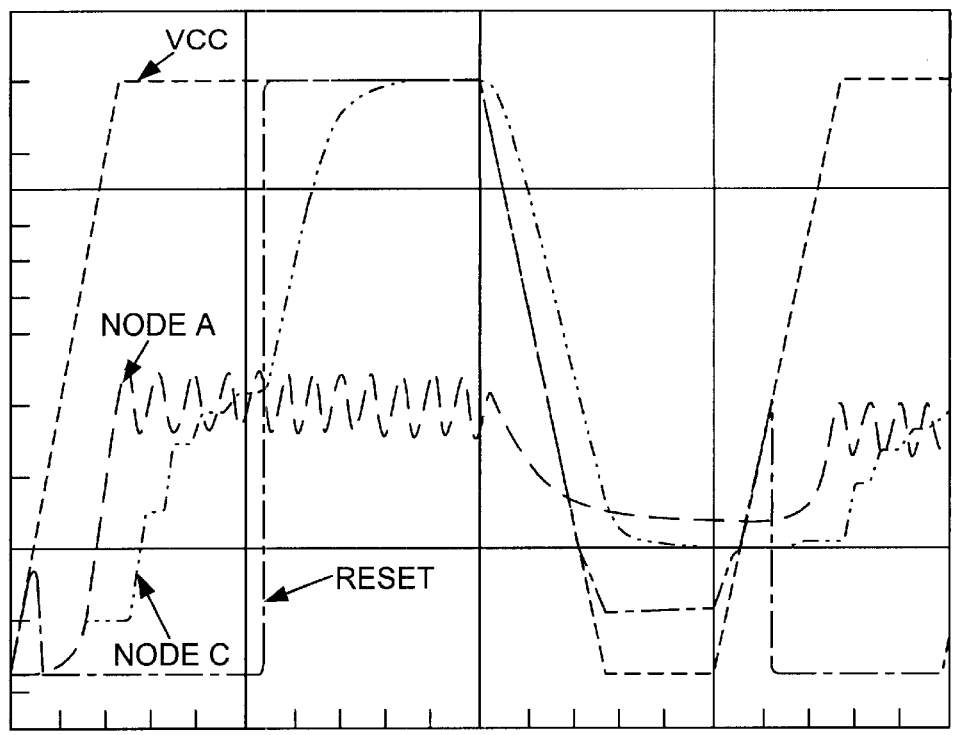
FIG. 4 is a timing diagram illustrating the operation of the present invention.
Figure 5:
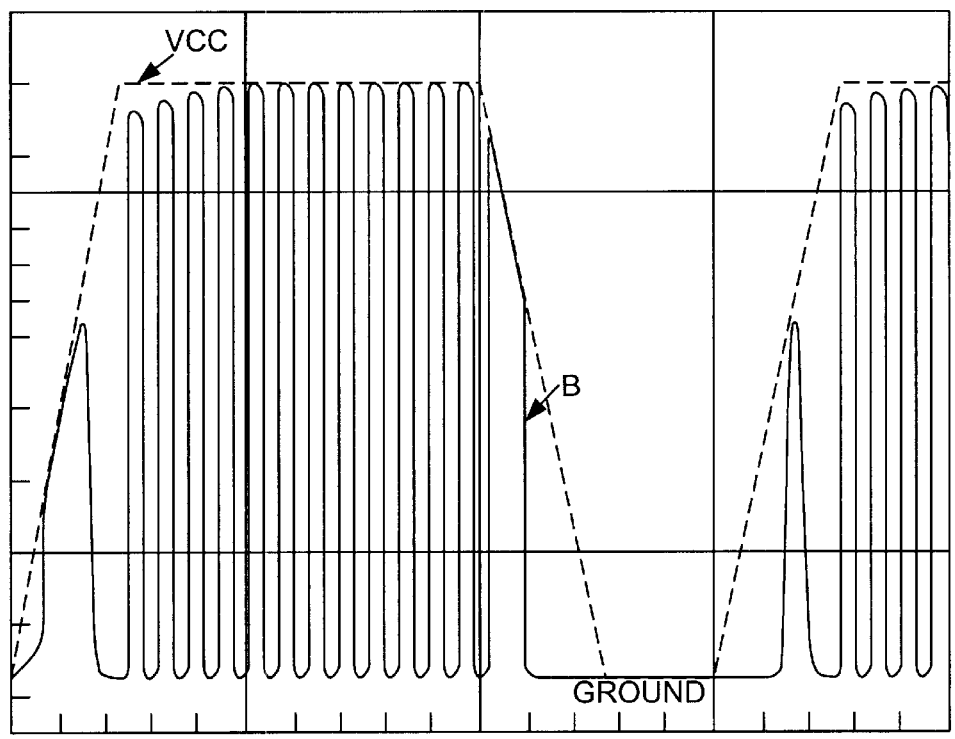
FIG. 5 is a timing diagram illustrating the operation of the oscillator in the present invention.

Referring to FIG. 4, a timing diagram illustrating the various signals of FIG. 3 is shown. When the node B is high, the transistor N1 is on and the node C is charging. When the node B is low, the transistor N1 is off and the node C generally holds the charge. When charge on the node C is equal to the threshold of the inverter INV2, the signal RESET is high (e.g., RESET is inactive). FIG. 5 illustrates a timing diagram of the signal PULSE at the node B.

Referring back to FIG. 3, the circuit 100 generally starts operation when power is applied to the oscillator circuit 101. The capacitor C1 generally charges a node A, through the resistor R1, towards a supply voltage VCC. When the node A reaches an upper trigger level (e.g., the positive threshold voltage VT+ of the inverter SCHMT), the inverter SCHMT output goes low and discharges the capacitor C1 through the resistor R1. As a result, the voltage at the node A drops. When the voltage at the node A reaches the lower threshold (e.g., the negative threshold voltage VT− of the inverter SCHMT), the output of the inverter SCHMT generally flips (e.g., changes from low to high or vice versa). This cycle repeats to start the oscillation of the signal PULSE. The pulse width (and hence the frequency) of the signal PULSE is generally determined by the value of the resistor R1, the capacitor C1 and the hysteresis (e.g., VT+−VT−) of the inverter SCHMT. Therefore the power dissipation in the inverter SCHMT is largely independent of the frequency of oscillation.

During power ramp up, before attaining full value, the node C is generally completely discharged to ground through the transistor P1. Such a discharge guarantees that no startup issues, due to external charge build up on the node C, are present. The transistor P1 may be implemented, in one example, as a P-channel transistor. However, the particular channel type of the transistor P1 may be varied accordingly to meet the design criteria of a particular implementation. In such a condition, the signal RESET is LOW (e.g., in an active configuration).

Once oscillation is started in the oscillator circuit 101, the node B may generate a train of pulses switching from VCC to ground. The transistor N1 may be diode connected with a series resistance of RN1 and generally forms a path from the node B through the capacitor C2. The signal RESET may be in a LOW state (e.g. the signal RESET is active). The transistor N1 may be implemented, in one example, as a N-channel transistor. However, the particular channel type of the transistors N1 may be varied accordingly to meet the design criteria of a particular implementation, and may be replaced, for example, by a junction diode.

When the node B is high, the transistor N1 generally conducts and charges the node C through the capacitor C2. The resistance RN1 times the capacitance of the capacitor C2 (e.g., to produce a time constant) is selected such that the time constant is much larger than the pulse width at the node B. When the node B is low, the transistor N1 is generally off and the node C holds the previous charge. The transistor N1 (along with the capacitor C2), may act as a diode clamper (or a charge pump). The voltage at the node C pumps up slowly to the supply voltage VCC minus a threshold voltage Vtn with each pulse at the input 111.

When the node C reaches the threshold of the inverter INV2, the output RESET generally trips and the signal RESET goes high (e.g., inactive). The transistor P2 may be implemented as a weak pull-up on the node C. The transistor P2 generally ensures that the node C is charged to the supply voltage VCC once the signal RESET is high (e.g., inactive). Such charging is done to reduce static current in the inverter INV2. The circuit 100 will work without the inverter INV2 but may consume more power. The transistor P2 may be implemented, in one example, as a P-channel transistor. However, the particular channel type of the transistor P2 may be varied accordingly to meet the design criteria of a particular implementation.

When the supply voltage VCC drops, the oscillations of the signal PULSE will stop and the output of the device SCHMT will be such that the node B will be at the driven low state. In such a condition, diode N1 is generally leaving no discharge path for the capacitor C2. The capacitor C2 then discharges through the transistor P1 (when the supply voltage VCC falls below a threshold value at the node C).

A brownout may be defined as a sharp dip in the supply voltage VCC. If the supply voltage VCC dips and goes back up again, the circuit 100 should assert the signal RESET (or RESETM) to reset the system. The signal RESET may be asserted when the supply voltage VCC is outside a predetermined range (e.g., +/−5%) and may be de-asserted when the supply voltage VCC is inside the predetermined range. The predetermined range may be varied accordingly to meet the design criteria of a particular implementation. The transistor P1 may provide a strong and low resistance path to ground to assure a fast discharge of the node C. The fast discharge generally ensures that the signal RESET is active when the supply voltage VCC goes back up. The brownout performance may be controlled by controlling the resistance of the discharge path. One advantage of the circuit 100 is that increasing the strength of the transistor P1 does not affect the activation of the power on reset signal RESET during normal operation. Hence, very good brownout characteristics may be achieved.

The circuit 100 may consume more power due to the oscillator circuit 101 being always on. However, many current applications may use RC oscillators for aiding crystal oscillator startup. In such an implementation the circuit 100 may be implemented without consuming extra current. It is generally known that relaxation oscillators have guaranteed stability. Such stability ensures that the power on reset will not fail, thereby providing a very robust circuit 100. Specifically, conventional power on resets are suspect under conditions of very slow power supply ramp up.

In one example, the inverter SCHMT may exhibit a great deal of sensitivity to the supply voltage VCC. This is due to the inverter SCHMT threshold voltages not being a constant percentage of the supply voltage VCC. While this may result in frequency stability being affected, the circuit 100 may continue to function properly. In particular the circuit 100 does not require stability of frequency for proper operation.

In another example, the circuit 100 may be implemented with only two capacitors (e.g., C1 and C2) and one resistor (e.g., R1). Such an implementation of the circuit 100 may be simple and require less die area to implement because of the reduced complexity. The transistor P1 generally assures a very good brown-out characteristic for the circuit 100. Most conventional power on reset circuits fail to detect power dips of 1us or less duration. The circuit 100, since there is a low resistance discharge path, may enable detection of brown-outs on the order of nanoseconds.

The present invention may be valuable in the implementation of a power on reset circuit that may allow for a quick response time in the event of a sharp power drop. The present invention may provide a power on reset circuit that may be based on any relaxation oscillator. Chips that already have an RC oscillator inside (e.g., for aiding crystal startup, etc.) may be used with the present invention to implement a robust power on reset solution with very little extra circuitry. In one implementation, trim options for the capacitor C1 may be provided. One trim option may trip the power on reset pulse width with respect to any frequency of oscillation. The present invention may use the transistor P1 as a unique way to ensure early brown out detection. The size of the transistor P1 may be large enough to improve discharge time, and may still not affect power-up characteristics. One implementation, based on the Schmitt trigger oscillator, may detect less than a 200 ns wide power glitch. The circuit 100 may provide a simple, compact and very robust solution, particularly for applications that do not require very low power consumption. However, the present invention may be tuned to operate in a low power consumption environment.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate a first signal comprising a series of pulses;
   a second circuit configured to generate a second signal in response to said first signal and said second signal, wherein said second signal is configured to control a reset of an external device; and
   a device configured as a diode, said device coupling said first circuit and said second circuit.

2. The apparatus according to claim 1, wherein said second signal is asserted when a supply voltage is outside a predetermined range and is de-asserted when said supply voltage is inside said predetermined range.

3. The apparatus according to claim 1, comprising a third circuit configured to generate one or more third signals in response to said second signal, wherein said one or more third signals are a digital true and a digital complement of said second signal.

4. The apparatus according to claim 1, wherein said first circuit comprises an oscillator circuit configured to generate said first signal.

5. The apparatus according to claim 1, wherein said second circuit is further configured in response to one or more control signals.

6. The apparatus according to claim 5, wherein said second circuit comprises a charge/discharge circuit configured to present said second signal.

7. The apparatus according to claim 5, wherein said second circuit comprises a charge circuit configured to reduce power consumption of said apparatus.

8. The apparatus according to claim 7, wherein said charge circuit is configured in response to one of said one or more control signals.

9. The apparatus according to claim 7, wherein said second circuit further comprises a discharge circuit configured to discharge said second circuit.

10. The apparatus according to claim 9, wherein said discharge circuit is configured in response to another one of said one or more control signals.

11. The apparatus according to claim 3, wherein said third circuit comprises a buffer circuit configured to present said one or more third signals, wherein one of said third signals is a digital complement of another one of said third signals.

12. The apparatus according to claim 1, wherein said first circuit comprises a relaxation oscillator.

13. The apparatus according to claim 1, wherein said second circuit comprises:
   a plurality of transistors,
   a capacitor having a first terminal connected to said plurality of transistors, and
   an inverter having (i) a first terminal connected to said first terminal of said capacitor and (ii) a second terminal connected to one or more of said plurality of transistors, wherein said inverter is configured to present said second signal at said second terminal.

14. The apparatus according to claim 13, wherein said transistors comprise one or more N-channel transistors and one or more P-channel transistors.

15. The apparatus according to claim 3, wherein said third circuit comprise one or more inverters.

16. The apparatus according to claim 1, wherein said apparatus comprises an oscillator based power-on-reset circuit.

17. An apparatus comprising:
   means for generating a first signal comprising a series of pulses;
   means for generating a second signal in response to said first signal and said second signal, wherein the second signal is configured to control the reset of an external circuit; and
   means for coupling said first signal from said first generating means to said second generating means.

18. A method for generating a power on reset signal, comprising the steps of:
   (A) generating said reset signal in response to a periodic signal and said reset signal;
   (B) generating said periodic signal comprising a series of pulses; and
   (C) coupling said periodic signal to a generator of said reset signal using a device configured as a diode.

19. The method according to claim 18, wherein the step (A) comprises the sub-steps of:
   receiving said periodic signal; and
   generating said reset signal having a de-asserted state in response to said periodic signal.

20. The method according to claim 18, further comprising the step of:
   generating one or more third signals in response to said reset signal and one or more control signals.

21. The method according to claim 20, wherein one of said third signals is a digital complement of another one of said third signals.

22. The method according to claim 18, wherein step (A) is further configured in response to one or more control signals.

\* \* \* \* \*